(12) United States Patent
Barth et al.

(10) Patent No.: US 8,159,060 B2
(45) Date of Patent: Apr. 17, 2012

(54) HYBRID BONDING INTERFACE FOR 3-DIMENSIONAL CHIP INTEGRATION

(75) Inventors: Karl W. Barth, Hopewell Junction, NY (US); Ricardo A. Donaton, Hopewell Junction, NY (US); Spyridon Galis, Hopewell Junction, NY (US); Kevin S. Petrarca, Hopewell Junction, NY (US); Shahab Siddiqui, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 215 days.

(21) Appl. No.: 12/608,368

(22) Filed: Oct. 29, 2009

(65) Prior Publication Data

US 2011/0101537 A1    May 5, 2011

(51) Int. Cl.
*H01L 23/02* (2006.01)
(52) U.S. Cl. .................................. 257/686; 257/777
(58) Field of Classification Search .................. 257/686, 257/777, 723, 724, 758
See application file for complete search history.

(56) References Cited

U.S. PATENT DOCUMENTS

| | | | |
|---|---|---|---|
| 6,627,985 B2 | 9/2003 | Huppenthal et al. | |
| 6,781,226 B2 | 8/2004 | Huppenthal et al. | |
| 6,800,930 B2 | 10/2004 | Jackson et al. | |
| 6,859,603 B2 | 2/2005 | Hryniewicz et al. | |
| 6,876,796 B2 | 4/2005 | Garito et al. | |
| 6,891,865 B1 | 5/2005 | Ma | |
| 6,962,867 B2 | 11/2005 | Jackson et al. | |
| 6,970,625 B2 | 11/2005 | Johannessen et al. | |
| 7,064,055 B2 | 6/2006 | Reif et al. | |
| 7,067,909 B2 | 6/2006 | Reif et al. | |
| 7,126,214 B2 | 10/2006 | Huppenthal et al. | |
| 7,282,951 B2 | 10/2007 | Huppenthal et al. | |
| 7,355,273 B2 | 4/2008 | Jackson et al. | |
| 2005/0110131 A1 | 5/2005 | Lee | |
| 2007/0090490 A1 | 4/2007 | Chang et al. | |
| 2008/0122115 A1 | 5/2008 | Popa et al. | |
| 2011/0175215 A1* | 7/2011 | Farooq et al. | 257/686 |
| 2011/0248396 A1* | 10/2011 | Liu et al. | 257/686 |
| 2011/0254165 A1* | 10/2011 | Muranaka | 257/751 |
| 2011/0266691 A1* | 11/2011 | Lin et al. | 257/774 |
| 2011/0291263 A1* | 12/2011 | West | 257/737 |
| 2011/0291266 A1* | 12/2011 | Jin et al. | 257/737 |
| 2011/0291267 A1* | 12/2011 | Wang et al. | 257/737 |

* cited by examiner

*Primary Examiner* — Sheila V. Clark
(74) *Attorney, Agent, or Firm* — Scully, Scott, Murphy & Presser, P.C.; Joseph P. Abate, Esq.

(57) ABSTRACT

Each of a first substrate and a second substrate includes a surface having a diffusion resistant dielectric material such as silicon nitride. Recessed regions are formed in the diffusion resistant dielectric material and filled with a bondable dielectric material. The patterns of the metal pads and bondable dielectric material portions in the first and second substrates can have a mirror symmetry. The first and second substrates are brought into physical contact and bonded employing contacts between metal pads and contacts between the bondable dielectric material portions. Through-substrate-via (TSV) structures are formed through bonded dielectric material portions. The interface between each pair of bonded dielectric material portions located around a TSV structure is encapsulated by two diffusion resistant dielectric material layers so that diffusion of metal at a bonding interface is contained within each pair of bonded dielectric material portions.

11 Claims, 7 Drawing Sheets

HYBRID BONDING INTERFACE FOR 3-DIMENSIONAL CHIP INTEGRATION

BACKGROUND

This invention relates to a bonded structure that provides high adhesion strength and containment of interfacial impurity diffusion and methods of manufacturing the same.

Bonding of multiple substrates is required to enable three-dimensional integration of chips. Bonding of two substrates can be effected by adhesion between two dielectric materials as in an oxide-to-oxide bonding that fuses silicon dioxide materials from two substrates after bonding, by adhesion between two metallic material as in a copper-to-copper bonding that employs direct contact between two copper pads and a subsequent grain growth across the original interface between the two copper pads, or by a method employing a combination of the two adhesion mechanisms.

Through-substrate-via (TSV) structures, formed after multiple substrates are bonded and optionally thinned, provide electrical connection across the multiple substrates in a bonded structure. A TSV structure includes a conductive material such as copper, which diffuses rapidly in the plane of the bonding interface between substrates because microscopic irregularities and cavities are present at the interface. Diffusion of the conductive material from a TSV structure can cause electrical shorts and reliability problems in the bonded structure. This can be caused by a misalignment during the bonding of the substrates.

An interface between diffusion resistant materials, such as silicon nitride, across bonded substrates can be employed to reduce later diffusion of conductive material from TSV structures. In this case, the diffusion resistant materials retard lateral diffusion of the conductive material from the TSV structures along the interface between two bonded substrates, thereby preventing electrical shorts. Adhesion between the substrates is provided by forming a metal-to-metal contact between metal pads that are embedded in the diffusion resistant materials of both substrates. In this structure, areas including TSV structures have an interface between two diffusion resistant materials of the two substrates. Such an interface between two diffusion resistant materials of the two substrates does not provide significant adhesion strength between the two substrates. The adhesion strength between the two substrates is mostly provided by the metal-to-metal contact between the metal pads that are embedded in the diffusion resistant materials. To provide sufficient adhesion strength between the two substrates in this type of structure, the area for the metal pads must be sufficiently large and the area for formation of TSV structures must be limited. This constraint also limits the number and/or size of the TSV structures and the capacity to transmit power and electrical signals across the bonded substrates. In addition to the diffusion resistant material and the metal across the substrates, there are areas of silicon oxide which will line up to the corresponding substrate for an oxide to oxide bond surface in conjunction with the metal to metal bonding.

BRIEF SUMMARY

In an embodiment of the present invention, each of a first substrate and a second substrate includes a surface having a diffusion resistant dielectric material such as silicon nitride. Recessed regions are formed in the diffusion resistant dielectric material and filled with a bondable dielectric material such as silicon oxide. Metal pads can be formed on the surfaces of the diffusion resistant dielectric material. The patterns of the metal pads and bondable dielectric material portions in the first and second substrates have a mirror symmetry. The first and second substrates are brought into physical contact and bonded employing contacts between the metal pads and contacts between the bondable dielectric material portions. Through-substrate-via (TSV) structures are formed through bonded dielectric material portions. The interface between each pair of bonded dielectric material portions located around a TSV structure is encapsulated by two diffusion resistant dielectric material layers so that diffusion of metal at a bonding interface is contained within each pair of bonded dielectric material portions. The vertical thickness of the diffusion resistant dielectric material determines the latitude or tolerance for overlay specification.

According to an aspect of the present invention, a bonded structure is provided, which includes a first substrate including a first diffusion resistant dielectric material layer and a first bondable dielectric material portion, wherein the first bondable dielectric material portion is embedded in the first diffusion resistant dielectric material layer; a second substrate including a second diffusion resistant dielectric material layer and a second bondable dielectric material portion, wherein the second bondable dielectric material portion is embedded in the second diffusion resistant dielectric material layer and the first and second bondable dielectric material portions are bonded to form a bonded dielectric material portion; and a through-substrate-via (TSV) structure extending through the first substrate and the second substrate. The bonded dielectric material portion laterally surrounds a portion of the TSV structure. Moreover, the first and second diffusion resistant dielectric material layers and the TSV structure encapsulate the bonded dielectric material portion.

According to another aspect of the present invention, a method of forming a bonded structure is provided. The method includes forming a first bondable dielectric material portion within a first diffusion resistant dielectric material layer that is located in a first substrate; forming a second bondable dielectric material portion within a second diffusion resistant dielectric material layer that is located in a second substrate; brining the first substrate and the second substrate into physical contact with each other and bonding the first and second bondable dielectric material portions to form a bonded dielectric material portion; forming a through-substrate-via (TSV) cavity that extends through the bonded dielectric material portion, whereby the bonded dielectric material portion contains a hole therethrough; and forming a through-substrate-via (TSV) structure extending through the first substrate and the second substrate by filling the TSV cavity.

DETAILED DESCRIPTION

As stated above, the present invention relates to a bonded structure that provides high adhesion strength and containment of interfacial impurity diffusion and methods of manufacturing the same, which are now described in detail with accompanying figures. The drawings are not necessarily drawn to scale.

As used herein, a "bonding" of a first element and a second element is a state or process in which the first element is attached to the second element by adhesion strength generated at an atomic or molecular level at an interface between the first element and the second element.

As used herein, a "bondable dielectric material" is a dielectric material of which two portions can be bonded to provide adhesion strength therebetween under conditions known in the art. For example, silicon oxide is a bondable dielectric material of which two portions can be bonded to provide adhesion strength therebetween under conditions employed for substrate bonding known in the semiconductor industry.

As used herein, a "bondable dielectric material portion" is a portion of a bondable dielectric material.

As used herein, a "diffusion resistant dielectric material" is a dielectric material that is known to block or retard diffusion of atomic metal. For example, silicon nitride is a diffusion resistant dielectric material.

As used herein, a "diffusion resistant dielectric material layer" is a patterned or unpatterned layer of a diffusion resistant dielectric material.

As used herein, a "through-substrate-via (TSV) structure" is a conductive structure extending through multiple substrates.

As used herein, an "electroplatable material" is a material that can be deposited by an electroplating process that is currently known or to be discovered in the future.

As used herein, "electroless plating" is a plating process of a non-galvanic type that involves several simultaneous reactions in an aqueous solution, which occur through release of hydrogen by a reducing agent thereby producing a negative charge on the surface of the part without the use of external electrical power.

As used herein, a "electroless-platable material" is a material that can be deposited by an electroless plating process that is currently known or to be discovered in the future.

Figure 1:
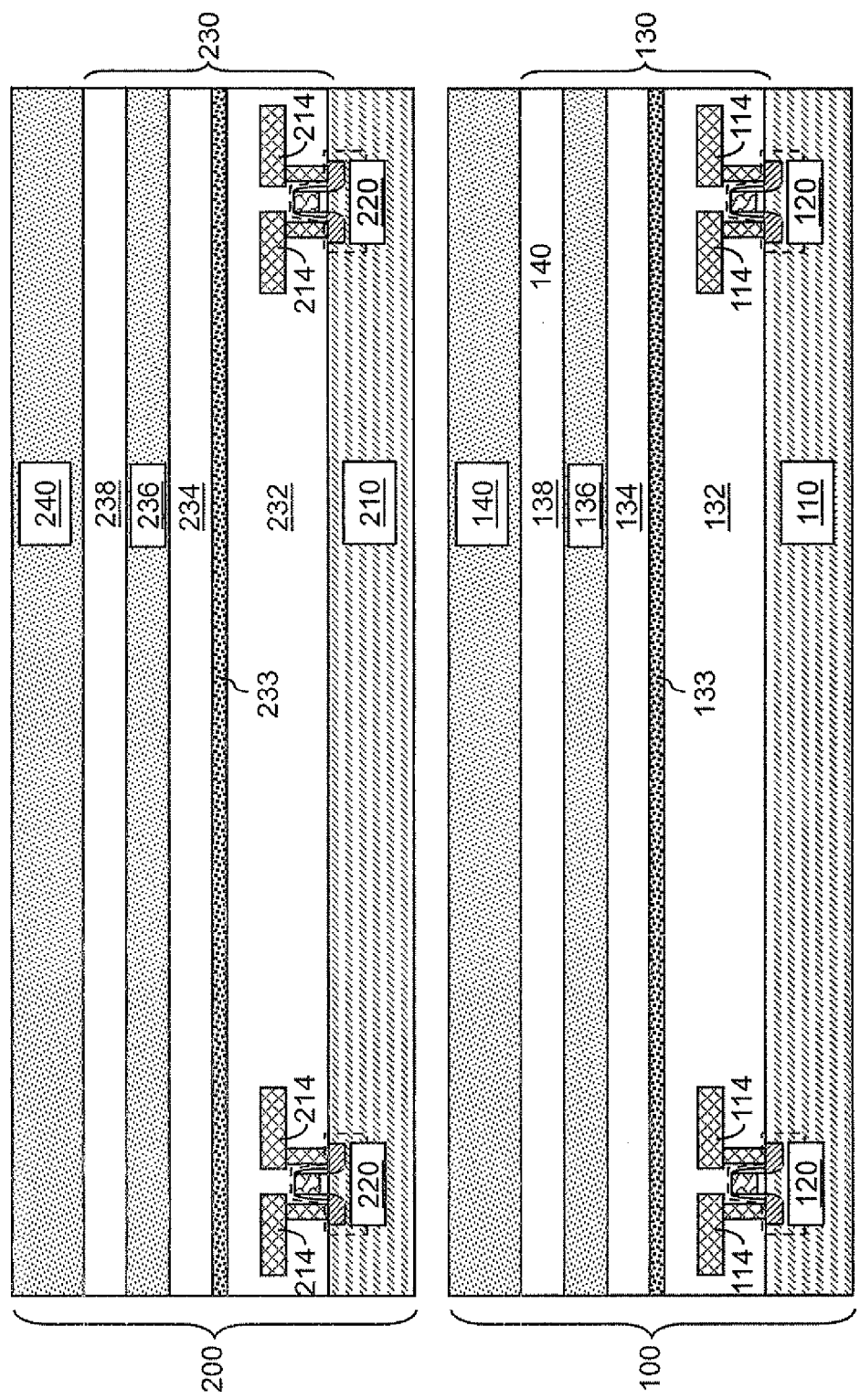
FIG. 1 is vertical cross-sectional view of an exemplary structure prior to formation of recessed regions on surfaces of diffusion resistant dielectric material layers according to an embodiment of the present invention.

Referring to FIG. 1, an exemplary structure according to an embodiment of the present invention includes a first substrate 100 and a second substrate 200. The first substrate 100 can include a first semiconductor substrate 110 and at least one first dielectric material layer 130 located thereupon. The second substrate 200 can include a second semiconductor substrate 210 and at least one second dielectric material layer 230 located thereupon. Each of the first and second semiconductor substrates (110, 210), if present, comprises a semiconductor material, which may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. For example, the semiconductor material can be silicon. Each of the first and second semiconductor substrates (110, 210) can be single crystalline. Each of the first substrate 100 and the second substrate 200 can include at least another substrate layer in addition to, or instead of, the first or second semiconductor substrates (110 or 210).

If the first substrate 100 includes a first semiconductor substrate 110, at least one first semiconductor device 120 can be present on the first semiconductor substrate 110. Likewise, if the second substrate 200 includes a second semiconductor substrate 210, at least one second semiconductor device 220 can be present on the second semiconductor substrate 210. Each of the at least one first semiconductor device 120 and the at least one second semiconductor device 220 can be, but is not limited to, a field effect transistor, a bipolar transistor, a diode, a resistor, a capacitor, a varactor, an inductor, a carbon nanotube device, or any other type of semiconductor device or a nanoscale device.

Each of the at least one first dielectric material layer 130 and the at least one second dielectric material layer 230 includes at least one dielectric material, which can be a doped or undoped silicate glass, silicon nitride, a low dielectric constant (low-k) chemical vapor deposition (CVD) material such as organosilicate glass, a low-k spin-on dielectric material such as SiLK™, BLoK™, NBLoCK™, or any other type of dielectric material that can be deposited or formed on a substrate and able to hold at least one metal pad therein. Further, at least one first metal interconnect structure 114 can be embedded in the at least one first dielectric material layer 130 to provide electrical connection to the at least one first semiconductor device 120. Likewise, at least one second metal interconnect structure 214 can be embedded in the at least one second dielectric material layer 240 to provide electrical connection to the at least one second semiconductor device 220.

Each of the at least one first dielectric material layer 130 and the at least one second dielectric material layer 230 can include a plurality of dielectric material layers having different compositions. In an illustrative example, the at least one first dielectric material layer 130 can include a first interconnect-level dielectric material layer 132, a first hardmask layer 133, a first lower silicon oxide layer 134, a first silicon nitride layer 136, and a first upper silicon oxide layer 138. In another illustrative example, the at least one second dielectric material layer 230 can include a second interconnect-level dielectric material layer 232, a second hardmask layer 233, a second lower silicon oxide layer 234, a second silicon nitride layer 236, and a second upper silicon oxide layer 238. The composition of the at least one first dielectric material layer 130 and the at least one second dielectric material layer 230 can include any dielectric material known in semiconductor processing technology and can be adjusted as needed.

An upper portion of the first substrate 100 includes a first diffusion resistant dielectric material layer 140 that includes a first diffusion resistant dielectric material, which can be silicon nitride. The thickness of the first diffusion resistant dielectric material layer 140 can be from 50 nm to 6,000 nm, and is typically from 200 nm to 2,000 nm, although lesser and greater thicknesses can also be employed. Likewise, an upper portion of the second substrate 200 includes a second diffusion resistant dielectric material layer 240 that includes a second diffusion resistant dielectric material, which can be silicon nitride. The thickness of the second diffusion resistant dielectric material layer 240 can be in the same range as the thickness of the first diffusion resistant dielectric material layer 140. The exposed surfaces, i.e., the upper surfaces, of the first and second diffusion resistant dielectric material layers (140, 240) can be planar.

Figure 2:
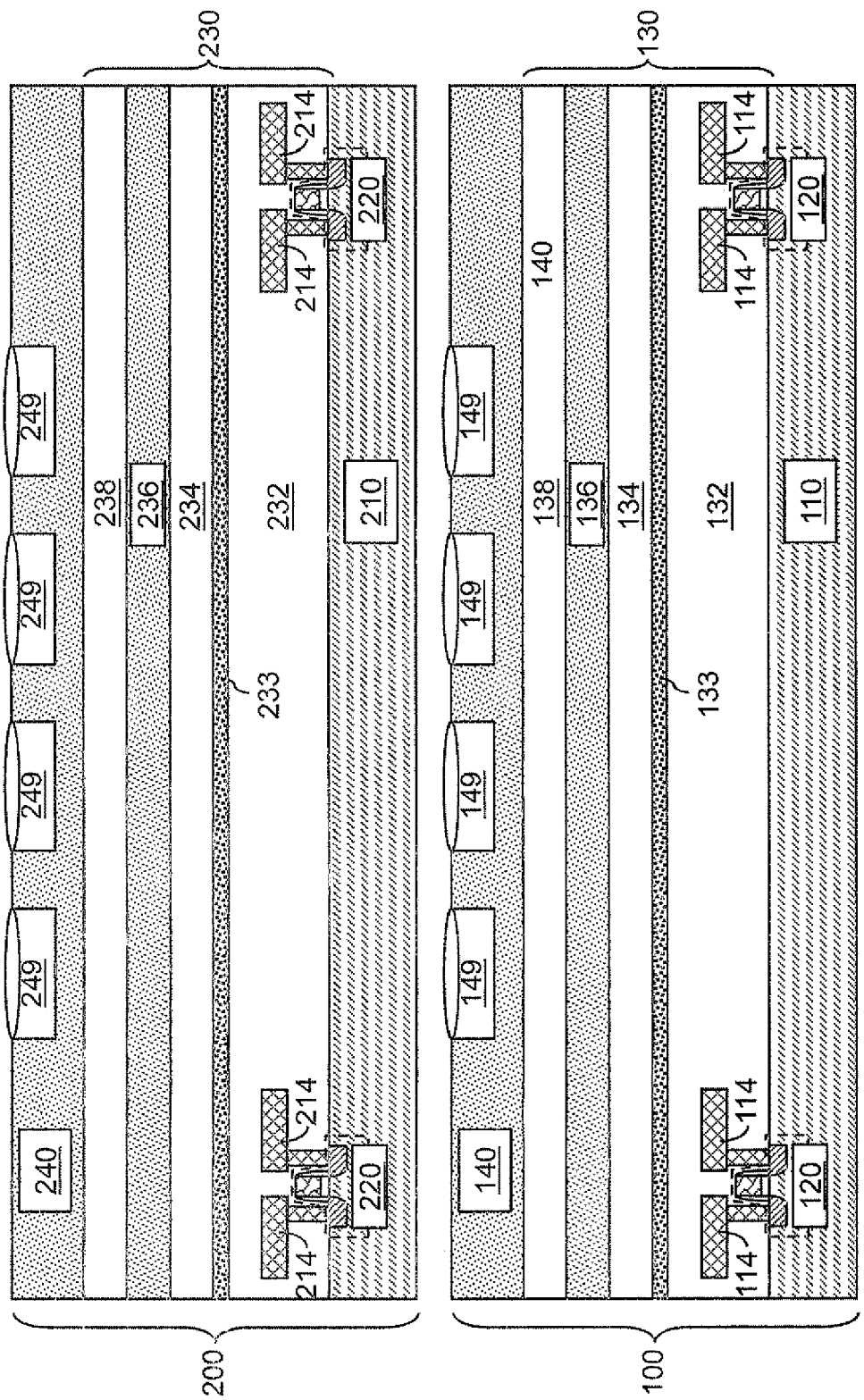
FIG. 2 is vertical cross-sectional view of the exemplary structure after formation of recessed regions on surfaces of diffusion resistant dielectric material layers according to an embodiment of the present invention.

Referring to FIG. 2, at least one first recessed region 149 is formed in the first diffusion resistant dielectric material layer 140 by recessing at least one portion of the upper surface of the diffusion resistant dielectric material layer 140. Formation of the at least one first recessed region 149 can be effected, for example, by applying a first photoresist (not shown) on the upper surface of the first diffusion resistant dielectric material layer 140, lithographically patterning the first photoresist to form at least one opening in the first photoresist, and transferring the pattern of the at least one opening in the first photoresist into the first diffusion resistant dielectric material layer 140 by an etch, which can be an isotropic etch or an anisotropic etch. Each of the at least one opening in the first photoresist is separated from any other of the at least one opening in the first photoresist by a remaining portion of the first photoresist, i.e., each opening in the first photoresist does not adjoin any other opening in the first photoresist. Consequently, each of the at least one first recessed region 149 does not adjoin any other of the at least one first recessed region 149. An isotropic etch can be a dry etch or a wet etch. An anisotropic etch can be a reactive ion etch. The remaining portions of the first photoresist is employed as an etch mask during the isotropic etch or the anisotropic etch.

The depth of the at least one first recessed region 149 is less than the thickness of the first diffusion resistant dielectric material layer 140, and can be from 30 nm to 4,000 nm, and is typically from 100 nm to 1,500 nm, although lesser and greater thicknesses can also be employed. Because the depth of the at least one first recessed region 149 is less than the thickness of the first diffusion resistant dielectric material layer 140, the first diffusion resistant dielectric material layer 140 does not include any hole after formation of the at least one first recessed region 149.

The same processing steps can be employed to form at least one second recessed region 249 in the second diffusion resistant dielectric material layer 240 by recessing at least one portion of the upper surface of the diffusion resistant dielectric material layer 240. If a second photoresist is employed, each opening in the second photoresist does not adjoin any other opening in the second photoresist. Consequently, each of the at least one second recessed region 249 does not adjoin any other of the at least one second recessed region 249. The depth of the at least one second recessed region 249 is less than the thickness of the second diffusion resistant dielectric material layer 240, and can be in the same range as the depth of the at least one first recessed region 149. Because the depth of the at least one second recessed region 249 is less than the thickness of the second diffusion resistant dielectric material layer 240, the second diffusion resistant dielectric material layer 240 does not include any hole after formation of the at least one second recessed region 249.

Preferably, the pattern of the at least one first recessed region 149 in the first diffusion resistant dielectric material layer 140 is a mirror image of the pattern of the at least one second recessed region 249 in the second diffusion resistant dielectric material layer 240.

Figure 3:
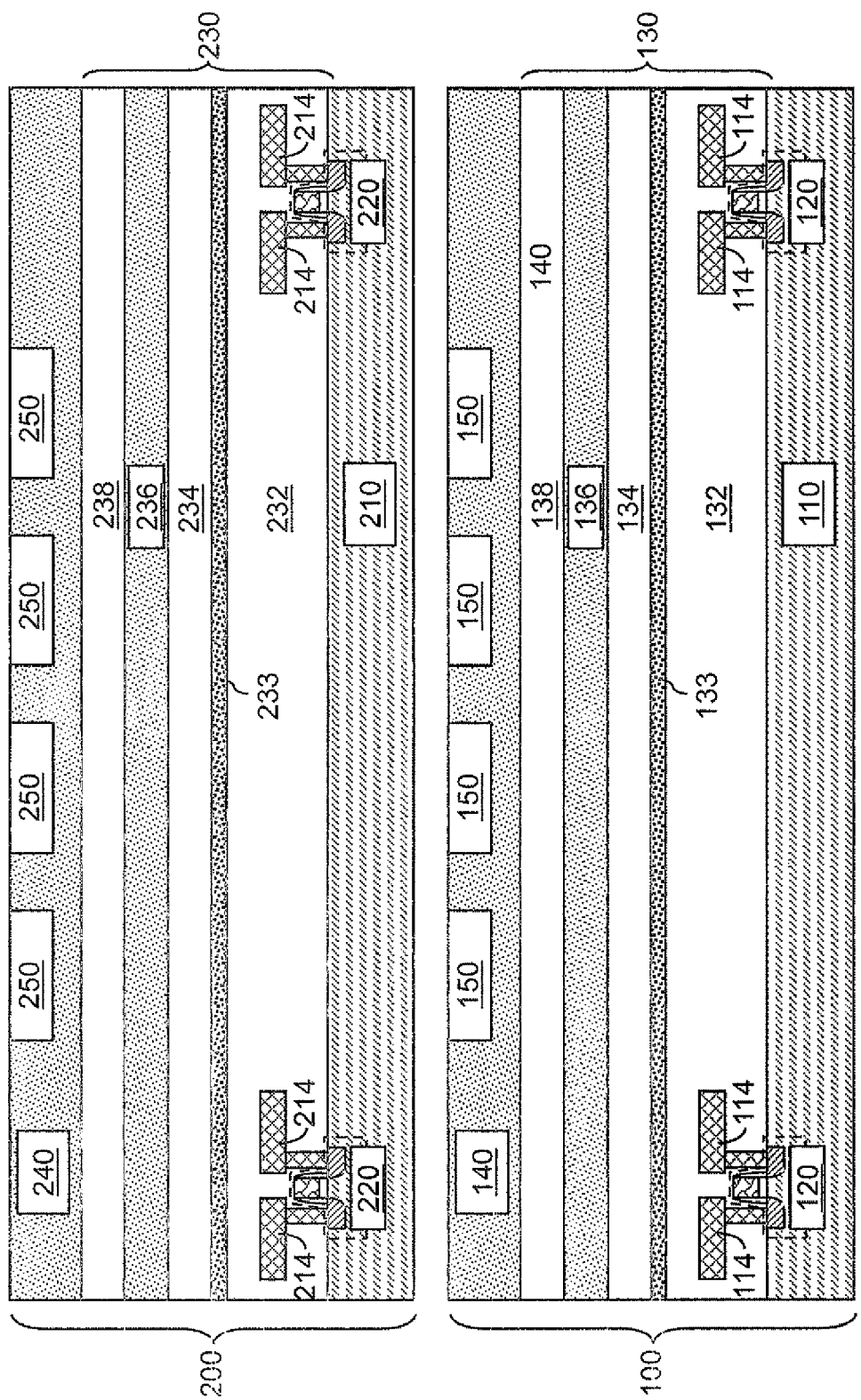
FIG. 3 is vertical cross-sectional view of the exemplary structure after formation of bondable dielectric material portions according to an embodiment of the present invention.

Referring to FIG. 3, at least one first bondable dielectric material portion 150 is formed in the at least one first recessed region 149, and at least one second bondable dielectric material portion 250 is formed in the at least one second recessed region 249.

For example, the at least one first bondable dielectric material portion 150 can be formed by filling the at least one first recessed region 149 of the first diffusion resistant dielectric material layer 140 with a first bondable dielectric material, and by planarizing the first bondable dielectric material to form the at least one first bondable dielectric material portion 150. The first bondable dielectric material is a bondable dielectric material, i.e., a portion of the first bondable dielectric material can be bonded with another portion of the first bondable material to provide adhesion strength therebetween under conditions known in the art. The first bondable dielectric material can be silicon oxide, which can be doped or undoped. The bondable dielectric material can be deposited by a conformal deposition, a non-conformal deposition, or a spin-on coating. The first bondable dielectric material can be planarized, for example, by a recess etch, a chemical mechanical planarization (CMP) processing step, or a combination thereof. The upper surface of the first diffusion resistant dielectric material layer 140 can be employed as an etch stop layer in a recess etch, or as a stopping layer in a CMP processing step.

The remaining portion(s) of the first bondable dielectric material constitute(s) the at least one first bondable dielectric material portion 150. Preferably, an exposed surface of the at least one first bondable dielectric material portion 150 is coplanar with, or is raised by no more than 1 nm relative to, the exposed surface of the first diffusion resistant dielectric material layer 140 after planarization of the first bondable dielectric material.

The at least one second bondable dielectric material portion 250 can be formed by filling the at least one second recessed region 249 of the second diffusion resistant dielectric material layer 240 with a second bondable dielectric material, and by planarizing the second bondable dielectric material to form the at least one second bondable dielectric material portion 250. The second bondable dielectric material is a bondable dielectric material. The second bondable dielectric material can be silicon oxide, which can be doped or undoped. Processing steps of the same type as the processing steps employed to form the at least one first bondable dielectric material portion 150 can be employed to form the at least one second bondable dielectric material portion 250. The remaining portion(s) of the second bondable dielectric material constitute(s) the at least one second bondable dielectric material portion 250. Preferably, an exposed surface of the at least one second bondable dielectric material portion 250 is coplanar with, or is raised by no more than 1 nm relative to, the exposed surface of the second diffusion resistant dielectric material layer 240 after planarization of the second bondable dielectric material.

If the first and second bondable dielectric materials are silicon oxide, the at least one first bondable dielectric material portion 150 and the at least one second bondable dielectric material portion 250 are portions of silicon oxide.

Figure 4:
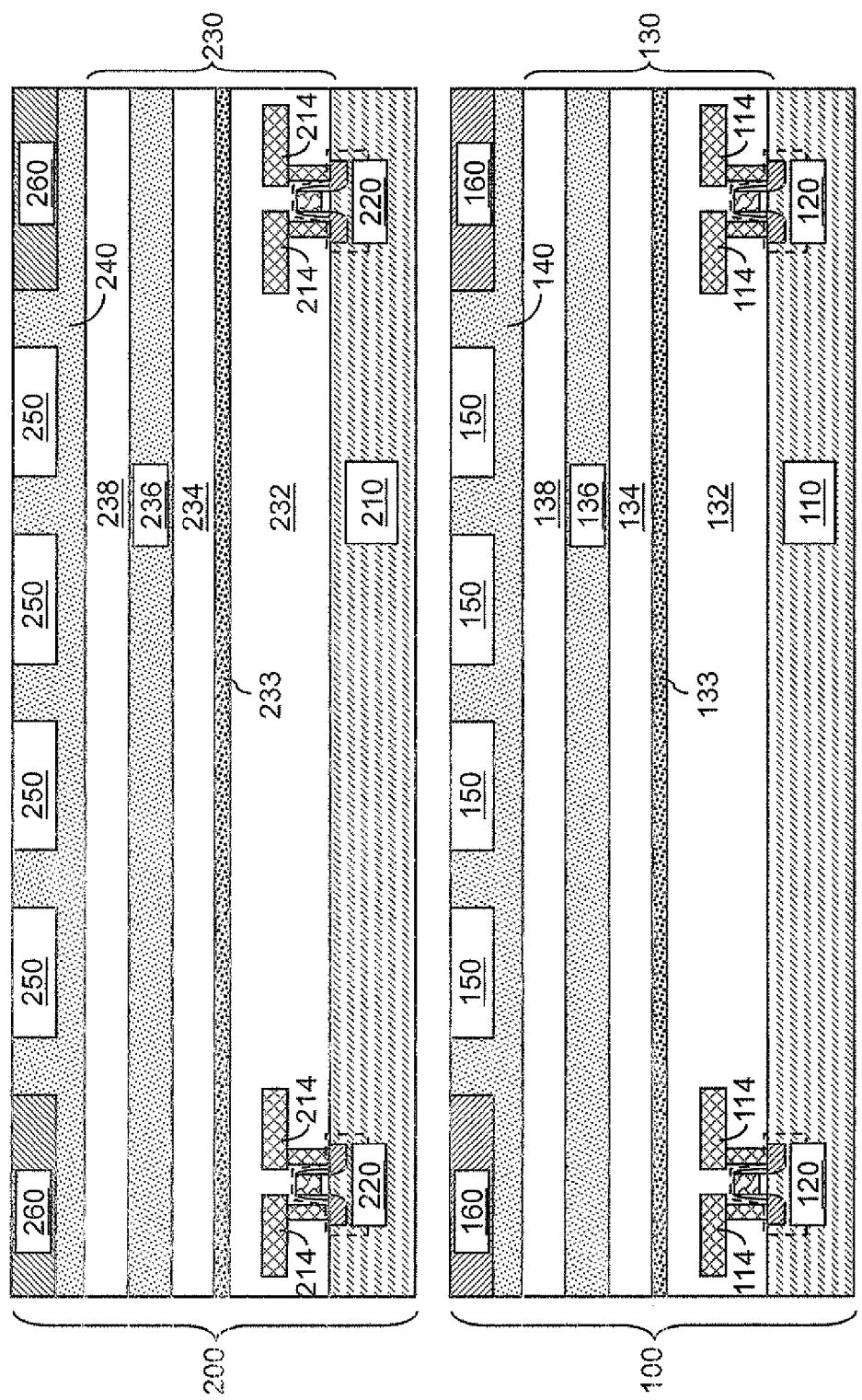
FIG. 4 is vertical cross-sectional view of the exemplary structure after formation of metal pads according to an embodiment of the present invention.

Referring to FIG. 4, at least one first metal pad 160 is formed in the first diffusion resistant dielectric material layer 140, and at least one first metal pad 160 is formed in the second diffusion resistant dielectric material layer 240.

For example, the at least one first metal pad 160 can be formed by forming at least one recessed region (not shown) in the first diffusion resistant dielectric material layer 140, by filling the at least one recessed region in the first diffusion resistant dielectric material layer 140 with a first metal layer, and by planarizing the first metal layer to form the at least one first metal portion 160. Preferably, the depth of the at least one recessed region is less than the thickness of the first diffusion resistant dielectric material layer 140, and the first diffusion resistant dielectric material layer 140 does not contain any hole after formation of the at least one recessed region therein. Alternately, upon bonding subsequent with the at least one second metal pad 260, the at least one first metal pad 160 can be employed as a bonding surface and as part of an electrical path between the at least one first semiconductor device 120 in the first substrate 100 and the at least one second semiconductor device 220 in the second substrate 200 after bonding to be performed subsequently.

The first metal layer can be a layer of an elemental metal or an intermetallic alloy. The first metal layer can be deposited by a physical vapor deposition (PVD), chemical vapor deposition (CVD), electroplating, electroless plating, or a combination thereof. The first metal can be Cu, Au, Ag, Ni, any other electroplatable material, any other electroless-platable material, or any other elemental metal or an alloy that can be deposited by CVD or PVD. The first metal can be planarized, for example, by a recess etch, a chemical mechanical planarization (CMP) processing step, or a combination thereof. The upper surface of the first diffusion resistant dielectric material layer 140 can be employed as an etch stop layer in a recess etch, or as a stopping layer in a CMP processing step. It is understood that any diffusible metal requires a metal liner that inhibits such a diffusion and promotes adhesion.

The remaining portion(s) of the first metal constitute(s) the at least one first metal pad 160. Preferably, an exposed surface of the at least one first metal pad 160 is coplanar with, or is raised by no more than 1 nm relative to, the exposed surface of the first diffusion resistant dielectric material layer 140 after planarization of the first metal. Preferably, the at least one first metal pad 160 comprises elemental Cu. Preferably, the top surface(s) of the at least one first metal pad 160 protrude(s) over the surface of the first diffusion resistant dielectric material layer 140 by dimension between 0 nm and 1 nm. During a subsequent bonding process, the metal in the at least one first metal pad 160 and the metal in the at least one second metal pad 260 deform such that the presence of the at least one first metal pad 160 does not interfere with the bonding process of the at least one first bondable dielectric material portion 150 with the at least one second bondable dielectric material portion 250.

The at least one second metal pad 260 can be formed by forming at least one recessed region (not shown) in the second diffusion resistant dielectric material layer 240, by filling the at least one recessed region in the second diffusion resistant dielectric material layer 240 with a second metal layer, and by planarizing the second metal layer to form the at least one second metal portion 260. Preferably, the depth of the at least one recessed region is less than the thickness of the second diffusion resistant dielectric material layer 240, and the second diffusion resistant dielectric material layer 240 does not contain any hole after formation of the at least one recessed region therein. Alternately, upon subsequent bonding with the at least one first metal pad 160, the at least one second metal pad 260 can be employed as part of an electrical path between the at least one first semiconductor device 120 in the first substrate 100 and the at least one second semiconductor device 220 in the second substrate 200.

The second metal layer can be a layer of an elemental metal or an intermetallic alloy. Any of the material for the at least one first metal pad 160 can be employed for the second metal layer. Processing steps of the same type as the processing steps employed to form the at least one first metal pad 160 can be employed to form the at least one second metal pad 260. The remaining portion(s) of the second metal layer after planarization constitute(s) the at least one second metal pad 260. Preferably, an exposed surface of the at least one second metal pad 260 is ay most coplanar with the exposed surface of the second diffusion resistant dielectric material layer 240 after planarization of the second metal. The at least one first metal pad 160 and the at least one second metal pad 260 can have the same metal, or can have different metals. Preferably, the at least one second metal pad 260 comprises elemental Cu. Preferably, the top surface(s) of the at least one second metal pad 260 protrude(s) over the surface of the second diffusion resistant dielectric material layer 240 by dimension between 0 nm and 1 nm. During the subsequent bonding process, the metal in the at least one first metal pad 160 and the metal in the at least one second metal pad 260 deform such that the presence of the at least one second metal pad 260 does not interfere with the bonding process of the at least one first bondable dielectric material portion 150 with the at least one second bondable dielectric material portion 250.

The formation of the at least one first metal pad 160 and/or the at least one second metal pad 260 is optional, i.e., the at least one first metal pad 160 and/or the at least one second metal pad 260 may, or may not, be present. If present, the at least one first metal pad 160 is embedded in the first diffusion resistant dielectric material layer 140 and/or the at least one second metal pad 260 is embedded in the second diffusion resistant dielectric material layer 240. Preferably, the exposed surfaces of the first diffusion resistant dielectric material layer 140, the at least one first bondable dielectric material portion 150, and the at least one first metal pad 160 are coplanar with, or are vertically offset by no more than 1 nm relative to, one another. Preferably, the exposed surfaces of the second diffusion resistant dielectric material layer 240, the at least one second bondable dielectric material portion 250, and the at least one second metal pad 260 are coplanar with, or are vertically offset by no more than 1 nm relative to, one another.

Figure 5:
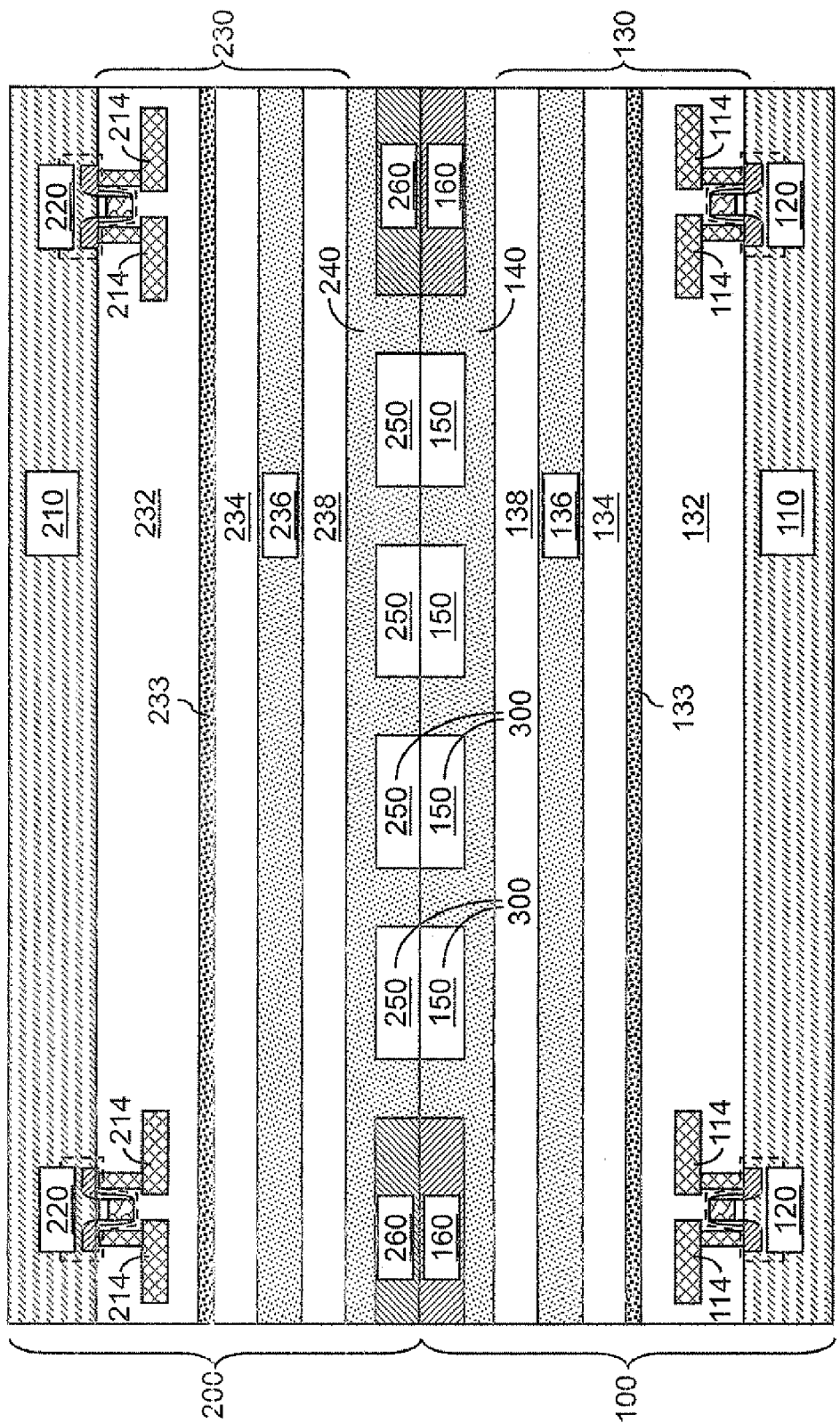
FIG. 5 is vertical cross-sectional view of the exemplary structure after bonding of first and second substrates according to an embodiment of the present invention.

Referring to FIG. 5, the second substrate 200 is flipped upside down and brought into physical contact with the first substrate 100. The first and second substrates (100, 200) are bonded to each other by effecting the bonding of each pair of vertically adjoining first and second bondable dielectric material portions (150, 250). Each pair of vertically adjoining first and second bondable dielectric material portions (150, 250) becomes a bonded dielectric material portion 300 after the bonding step.

Specifically, the first substrate 100 and the second substrate 200 are aligned to each other after flipping the second substrate 200 upside down so that each of the at least one first bondable dielectric material portion 150 is aligned to one of the at least one second bondable dielectric material portion 250. Once first and second bondable dielectric material portions (150, 250) contact each other in each vertically aligned pair, the assembly of the first and second substrates (100, 200) is subjected to a bonding process known in the art, which can include thermal cycling at an elevated temperature from 50° C. to 400° C., and typically from 100° C. to 300° C., and/or application of pressure so that the first and second substrates (100, 200) are pushed against each other. During the bonding process, each vertically adjoining pair of a first bondable dielectric material portion 150 and a second bondable dielectric material portion 250 are bonded at an interface therebetween to form a bonded dielectric material portion 300, which includes the materials in the first and second bondable dielectric material portions (150, 250) in a form that provides an adhesive strength across the interface between the first and second bondable dielectric material portions (150, 250). If the first and second bondable dielectric material portions (150, 250) comprise silicon oxide, the bonded dielectric material portion 300 comprises silicon oxide.

The interface between the at least one first bondable dielectric material portion 150 and the at least one second bondable dielectric material portion 250 is coplanar with, or are vertically offset by no more than 1 nm relative to, the interface between the first diffusion resistant dielectric material layer 140 and the second diffusion resistant dielectric material layer 240. If the at least one first metal pad 160 and the at least one second metal pad 260 are present, each pair of vertically adjoining first and second metal pads (160, 260) can be bonded simultaneously with the formation of the at least one bonded dielectric material portion 300 through bonding of the vertically adjoining pairs of the first and second bondable dielectric material portions (150, 160). In this case, the interface between the at least one first metal pad 160 and the at least one second metal pad 260 is coplanar with, or are vertically offset by no more than 1 nm relative to, the interface between the first diffusion resistant dielectric material layer 140 and the second diffusion resistant dielectric material layer 240.

Figure 6:
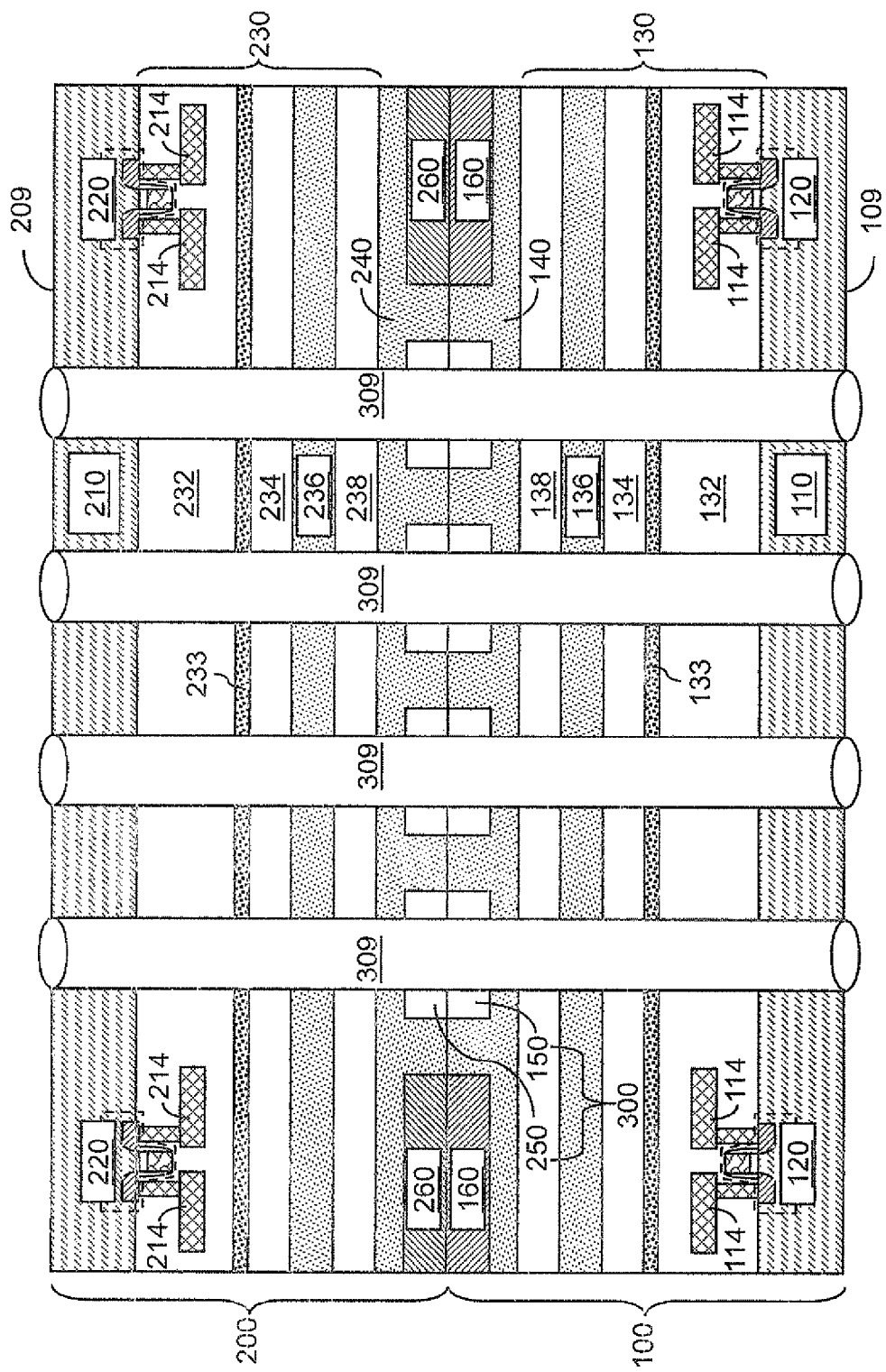
FIG. 6 is vertical cross-sectional view of the exemplary structure after formation of through-substrate-via (TSV) cavities according to an embodiment of the present invention.

Referring to FIG. 6, at least one through-substrate-via (TSV) cavity 309 is formed through the assembly of the first and second substrates (100, 200). Each of the at least one TSV cavity 309 extends through the at least one bonded dielectric material portion 300. Thus, each bonded dielectric material portion 300 can contain a hole therethrough after formation of the at least one TSV cavity 309.

The first substrate 100 has a first end surface 109 located on an opposite side of the first diffusion resistant dielectric material layer 140, and the second substrate 200 has a second end surface 209 located on an opposite side of the second diffusion resistant dielectric material layer 240. Each of the at least one TSV cavity 309 extends from the first end surface 109 to the second end surface 209. Alternately, any of the at least one TSV cavity 309 can extend to any depth between first end surface 109 and the second end surface 209.

The at least one TSV cavity 309 can be formed, for example, by applying a photoresist (not shown) on an upper surface of the assembly of the first and second substrates (100, 200), which can be the second end surface 209 or the first end surface 109 depending on the orientation of the assembly of the first and second substrates (100, 200). The photoresist can be lithographically patterned to form at least one opening, and the pattern of the at least one opening is transferred into the assembly of the first and second substrates (100, 200) by an anisotropic etch, such as a reactive ion etch, that employs the remaining portions of the photoresist as an etch mask. Alternatively, at least one hard mask layer (not shown) can be deposited directly on the upper surface of the assembly of the first and second substrates (100, 200) prior to application of the photoresist. In this case, the pattern in the photoresist can be transferred into the at least one hard mask layer to form at least one holes therein, i.e., to form at least one patterned hard mask layer, which can be subsequently employed as an etch mask during an anisotropic etch that forms the at least one TSV cavity 309.

The lateral dimensions of the at least one TSV cavity 309 can be from 200 nm to 25,000 nm, and typically from 5000 nm to 20,000 nm, although lesser and greater lateral dimensions can also be employed. The lateral dimensions can be, for example, a diameter of a circular horizontal cross-sectional area, a major axis of an elliptical horizontal cross-sectional area, a minor axis of an elliptical horizontal cross-sectional area, or a length of a side of a polygonal a horizontal cross-sectional area of the one of the at least one TSV cavity 309.

Figure 7:
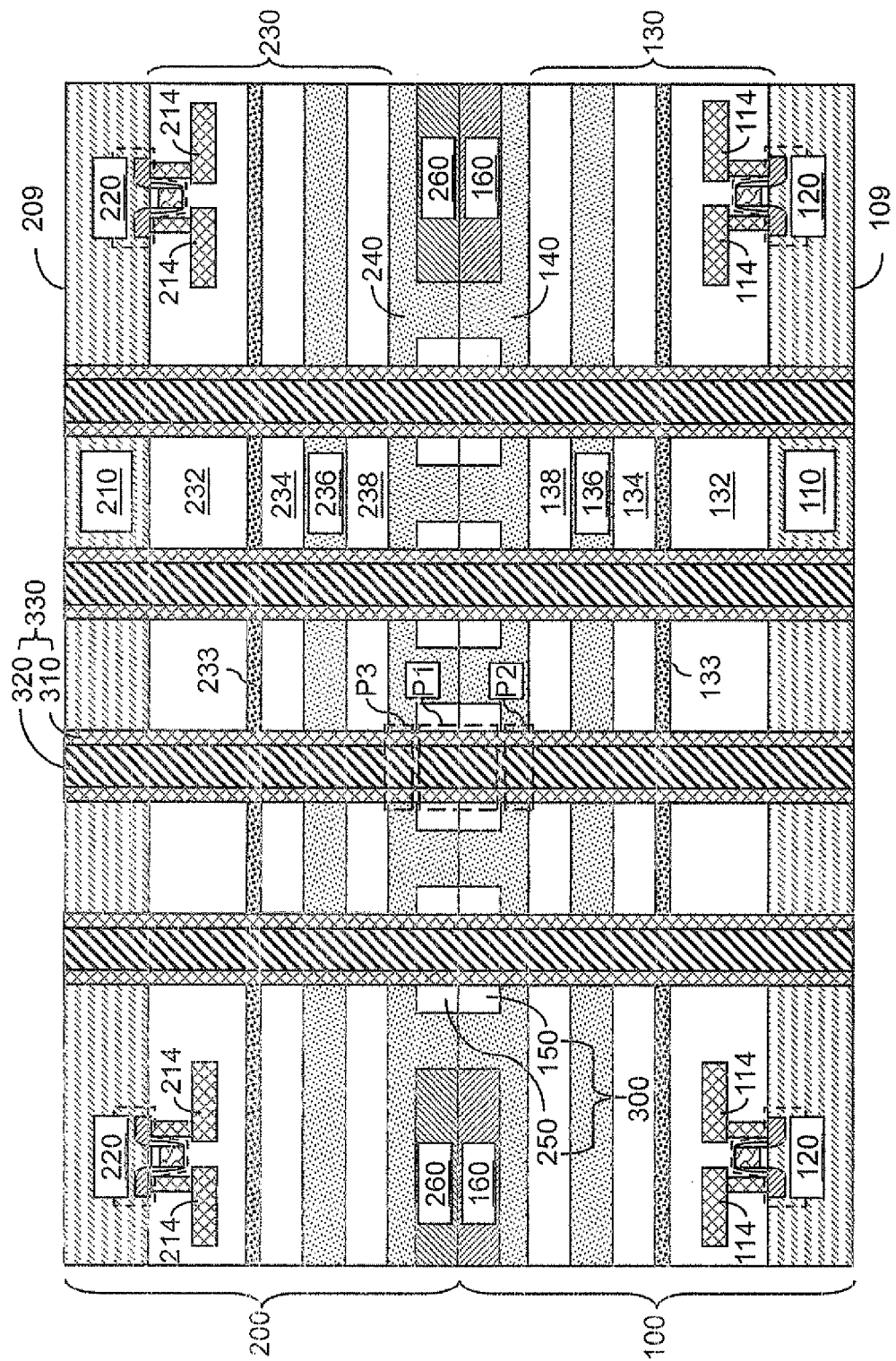
FIG. 7 is vertical cross-sectional view of the exemplary structure after formation of through-substrate-via (TSV) structures according to an embodiment of the present invention.

Referring to FIG. 7, at least one through-substrate-via (TSV) structure 330 is formed by filling the at least one TSV cavity 309 with at least one conductive material. Each of the at least one TSV structure 330 can include a through-substrate-via (TSV) liner 310 and a through-substrate-via (TSV) fill portion 320. A pair of a TSV fill portion 320 and a TSV liner 310 collectively can constitute a TSV structure 330.

The at least one TSV liner 310 can be formed directly on sidewalls of the at least one TSV cavity 309, i.e., can contact the sidewalls of the at least one bonded dielectric material portion 300, the sidewalls of the first and second diffusion resistant dielectric material layers (140, 240), the sidewalls of the at least one first dielectric material layer 130 and the at least one second dielectric material layer 230, and the sidewalls of the first and second semiconductor substrates (110, 120). The at least one TSV liner 310 can be formed, for example, by chemical vapor deposition. The at least one TSV liner 310 can be a semiconductor material such as a metallic material such as elemental metal, an intermetallic alloy, a conductive metal nitride, a conductive metal carbide, or a combination thereof. For example, the at least one TSV liner 310 can be WN, Ti, TiN, Ta, TaN, or a combination thereof.

The at least one TSV fill portion 320 is formed on sidewalls of the TSV liner 310, for example, by chemical vapor deposition, electroplating, electroless plating, or a combination thereof. The at least one TSV fill portion 320 can include an elemental metal or an intermetallic alloy. In case the at least one TSV fill portion 320 is formed by electroplating or electroless plating, the at least one TSV fill portion 320 can be composed of an electroplatable material or an electroless-platable material, which can be, for example, Ni, Au, Ag, Cu, Rh, Ru, Ir, Cr, Sn, Zn, Cd, CoWP, or combinations thereof.

Preferably, the at least one TSV liner 310 and the at least one TSV fill portion 320 completely fill all of the at least one TSV cavity 309. Any excess conductive material deposited on the first end surface 109 and the second end surface 209 is removed, for example, by a blanket etch or planarization. Thus, each of the at least one TSV structure 330 extends from the first end surface 109 through the first and second substrates (100, 200) to the second end surface 209.

The exemplary structure in FIG. 7 is a bonded structure including a first substrate 100, a second substrate 200, and at least one TSV structure 330. The first substrate 100 includes a first diffusion resistant dielectric material layer 140 and at least one first bondable dielectric material portion 150. The at least one first bondable dielectric material portion 150 is embedded in the first diffusion resistant dielectric material layer 140. The second substrate 200 includes a second diffusion resistant dielectric material layer 240 and at least one second bondable dielectric material portion 250. The at least one second bondable dielectric material portion 250 is embedded in the second diffusion resistant dielectric material layer 240. Each vertically adjoined pair of first and second bondable dielectric material portions (150, 250) is bonded to form a bonded dielectric material portion 300. Each of the at least one TSV structure 330 extending through the first substrate 100 and the second substrate 200. Each bonded dielectric material portion 300 laterally surrounds a portion, which is herein referred to as a first portion P1, of a TSV structure 330. Each bonded dielectric material portion 300 is encapsulated by the first and second diffusion resistant dielectric material layers (140, 240) and a TSV structure 330.

For each first portion P1 of a TSV structure 330 laterally surrounded by a bonded dielectric material portion 300, a second portion P2 of the TSV structure 330 is laterally surrounded by the first diffusion resistant dielectric material layer 140 and a third portion P3 of the TSV structure 330 is laterally surrounded by the second diffusion resistant dielectric material layer 240. The second portion P2 of a TSV structure 330 is vertically spaced from the third portion P3 of the TSV structure 330 by the first portion P1 of the TSV structure 330.

The interface within a bonded dielectric material portion 300, i.e., the interface between a bonded pair of first and second bondable dielectric material portions (150, 250), is prone to diffusion of metallic impurities, which can be provided by the a TSV structure 330 laterally surrounded by the bonded dielectric material portion 300. However, the diffusion of metallic impurities is confined within the volume of the bonded dielectric material portion 300 because the portions of the first and second diffusion resistant dielectric material layers (140, 240) surrounding the bonded dielectric material portion 300 function as a diffusion barrier to the metallic impurities that can be present in the bonded dielectric material portion 300. The interface between the first and second diffusion resistant dielectric material layers (140, 240) provide a tight seal that blocks or prevents diffusion of metallic impurities outside the volume of the bonded dielectric material portion 300 therein. Thus, electrical shorts between adjacent TSV structures 300 by metallic diffusion are prevented by the exemplary structure in FIG. 7.

While the present invention has been particularly shown and described with respect to preferred embodiments thereof, it will be understood by those skilled in the art that the foregoing and other changes in forms and details can be made without departing from the spirit and scope of the present invention. It is therefore intended that the present invention not be limited to the exact forms and details described and illustrated, but fall within the scope of the appended claims.

What is claimed is:

1. A bonded structure comprising:
   a first substrate including a first diffusion resistant dielectric material layer and a first bondable dielectric material portion, wherein said first bondable dielectric material portion is embedded in said first diffusion resistant dielectric material layer;
   a second substrate including a second diffusion resistant dielectric material layer and a second bondable dielectric material portion, wherein said second bondable dielectric material portion is embedded in said second diffusion resistant dielectric material layer and said first and second bondable dielectric material portions are bonded to form a bonded dielectric material portion; and
   a through-substrate-via (TSV) structure extending through said first substrate and said second substrate, wherein said bonded dielectric material portion laterally surrounds a portion of said TSV structure and is encapsulated by said first and second diffusion resistant dielectric material layers and said TSV structure.

2. The bonded structure of claim 1, wherein a surface at which said first and second bondable dielectric material portions are bonded is coplanar with an interface between said first and second diffusion resistant dielectric material layers.

3. The bonded structure of claim 1, wherein said first diffusion resistant dielectric material layer laterally surrounds a second portion of said TSV structure and said second diffusion resistant dielectric material layer laterally surrounds a third portion of said TSV structure.

4. The bonded structure of claim 3, wherein said second portion of said TSV structure is vertically spaced from said third portion of said TSV structure by said portion of said TSV structure.

5. The bonded structure of claim 1, wherein said first substrate has a first end surface located on an opposite side of said first diffusion resistant dielectric material layer, said second substrate has a second end surface located on an opposite side of said second diffusion resistant dielectric material layer, and said TSV structure extends from said first end surface to said second end surface.

6. The bonded structure of claim 1, wherein said TSV structure comprises a through-substrate-via (TSV) liner and a through-substrate-via (TSV) fill portion, wherein said TSV liner comprises an elemental metal, an intermetallic alloy, a conductive metal nitride, a conductive metal carbide, or a combination thereof, and said TSV fill portion comprises an elemental metal or an intermetallic alloy.

7. The bonded structure of claim 6, wherein said TSV fill portion comprises an electroplatable material or an electroless-platable material.

8. The bonded structure of claim 1, further comprising:
   a first metal pad embedded in said first diffusion resistant dielectric material layer; and
   a second metal pad embedded in said second diffusion resistant dielectric material layer and bonded to said first metal pad.

9. The bonded structure of claim 8, wherein an interface between said first metal pad and said second metal pad is coplanar with an interface between said first diffusion resistant dielectric material layer and said second diffusion resistant dielectric material layer.

10. The bonded structure of claim 1, wherein said first and second bondable dielectric material portions are portions of silicon oxide and said first and second diffusion resistant dielectric material layers are layers of silicon nitride.

11. The bonded structure of claim 1, wherein each of said first and second substrates includes a semiconductor substrate and at least one semiconductor device located thereupon.

* * * * *